United States Patent [19]

Rosenow

[11] Patent Number: 4,996,654

[45] Date of Patent: Feb. 26, 1991

[54] METHOD OF DISPLAYING ACQUIRED DATA

[75] Inventor: Barry L. Rosenow, Beaverton, Oreg.

[73] Assignee: Tektronix, Inc., Beaverton, Oreg.

[21] Appl. No.: 289,660

[22] Filed: Dec. 22, 1988

[51] Int. Cl.⁵ .................... G06F 15/74; G06F 15/00
[52] U.S. Cl. ................................. 364/521; 364/487
[58] Field of Search .......................... 364/484–487, 364/482, 521; 324/77 R, 77 B, 114, 115; 340/657, 658

[56] References Cited

U.S. PATENT DOCUMENTS

| | | | |
|---|---|---|---|
| 4,527,113 | 7/1985 | Hillerich | 324/534 |
| 4,571,588 | 2/1986 | Lee et al. | 324/115 |
| 4,751,504 | 6/1988 | Slavin | 364/487 X |
| 4,761,640 | 8/1988 | Slavin | 364/487 X |
| 4,812,996 | 3/1989 | Stubbs | 364/487 |

Primary Examiner—Gary V. Harkcom
Assistant Examiner—Michael A. Jaffe
Attorney, Agent, or Firm—William K. Bucher

[57] ABSTRACT

A method of displaying acquired data where a full screen base line display is scaled to represent the total duration of a device under test. Acquired data points are positioned on the base line display at locations proportional to their time of occurrence in the test. Icons, symbolic of the type of event associated with the acquired data points, are shown on the base line display. A movable bifurcating cursor points to the events and associated alphanumeric displays give distance and type of event information.

4 Claims, 7 Drawing Sheets

| TYPE OF EVENT | DEFINITION | TEXT MESSAGE | ICON |
|---|---|---|---|
| START | ZERO DISTANCE | START OF CABLE | ⊥ |
| REFLECTION | REFLECTION WITH LOSS < THRESHOLD | REFLECTION AT 10000m | ⊣⊢ |
| REFLECTION WITH LOSS | REFLECTION WITH LOSS >= THRESHOLD | 2.5dB LOSS AT 10000m | ┼ |
| REFLECTIONLESS LOSS | LOSS >= THRESHOLD | 2.5dB LOSS AT 10000m | ┼ |
| END OF CABLE | SIGNAL FALLS INTO NOISE FLOOR | NO CABLE FOUND AFTER 10000m | ⌐ |

METHOD OF DISPLAYING ACQUIRED DATA

BACKGROUND OF THE INVENTION

The present invention relates to a method for displaying acquired data from a system under test and more specifically to a method for symbolically displaying acquired time domain reflectometry data.

With the increased capabilities of modern test equipment to acquire and display data, it becomes much more difficult for a user to assimilate and interpret the information being presented on a display screen. Such products as oscilloscopes, spectrum analyzers, logic analyzers, and time domain reflectometers provide the user with multiple readouts, cursors, and displays which, in many cases, must be interpreted by the user. This requires the operator to have a high level of training and experience with the test equipment and in the technical area in which the operator works.

In testing fiber optic cables, an operator uses an optical time domain reflectometer, OTDR, to locate reflections and faults in the fiber optic cable. The OTDR display generally consists of an amplitude versus time plot on a cathode ray tube showing a generally decreasing amplitude of a return signal representing the backscatter from the fiber optic cable. Reflections from splices and the like appear as pulses on the backscatter ramp and generally result in some loss. Also losses may be encountered in the optical cable in the absence of reflections.

In performing tests on fiber optic cables, an operator must have some knowledge of the length of the cable, cable splice locations, and the losses associated with these splices. The operator then manually sets-up the OTDR using front panel controls by selecting the vertical and horizontal scale, the pulse length of the transmitted signal, and the like. After the data is acquired and displayed, the operator manually manipulates the front panel controls to determine parameters, such as cable length, distance to an event, e.g. reflection or loss, and the average loss of the cable. It is possible in such tests that significant events could be overlooked if the OTDR was not set-up properly or the operator misinterpreted the display.

What is needed is test equipment that requires substantially less training and experience for an operator. The test equipment should have the capability to be easily set-up and provide a display that presents the data in a form that does not require interpretation by the operator.

SUMMARY OF THE INVENTION

Accordingly, the present invention provides a method for displaying acquired data in which a scaling factor is calculated based on a delay component in the acquired data from a start event to an end event to produce a full screen base line display representative of the duration of the test of the system. The base line display is composed of individual pixel locations and a determination is made for each acquired data point using the delay component for each data point and the calculated scale factor for placement of the event at the appropriate pixel location on the base line display. The pixel locations for each acquired data point are stored in memory and displayed on the base line display at the appropriate location representative of the location within the test duration where the event occurred. A graphical representation of the event is displayed at the appropriate pixel locations based on a type of event component for each acquired data point.

In a specific embodiment of the present invention a method of displaying acquired time domain reflectometry data having a type of event component, a delay time component, and a signal loss component is presented.

The objects, advantages and novel features of the present invention are apparent from the following detailed description when read in conjunction with the appended claims and attached drawings.

DETAILED DESCRIPTION

Figure 1:
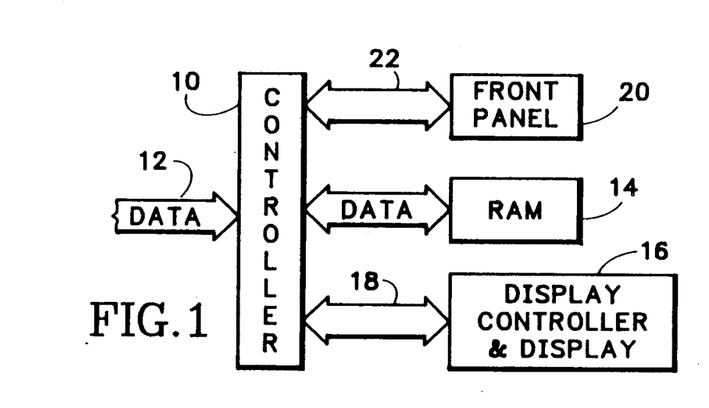
FIG. 1 is a simplified block diagram of a portion of a test instrument used in implementing the present invention.

Referring to FIG. 1, there is shown a simplified block diagram of a portion of an electronic circuit for an electronic test instrument, such as a time domain reflectometer, spectrum analyzer, or the like, having a controller 10, such as a microprocessor, coupled to receive acquired data 12 from associated acquisition circuitry, not shown. The acquired data is stored in RAM 14 where it is accessed by the controller for further processing and sent to a display controller and display 16 via data and control lines 18. Front panel controls 20 for setting-up the instrument and manipulating the display are coupled to the controller via data and control lines 22. Those having ordinary skill in the electronic art can easily see that the separate data and control lines can be substituted with a suitable data bus for connecting the controller to the various electronic elements in the block diagram.

Figure 2:
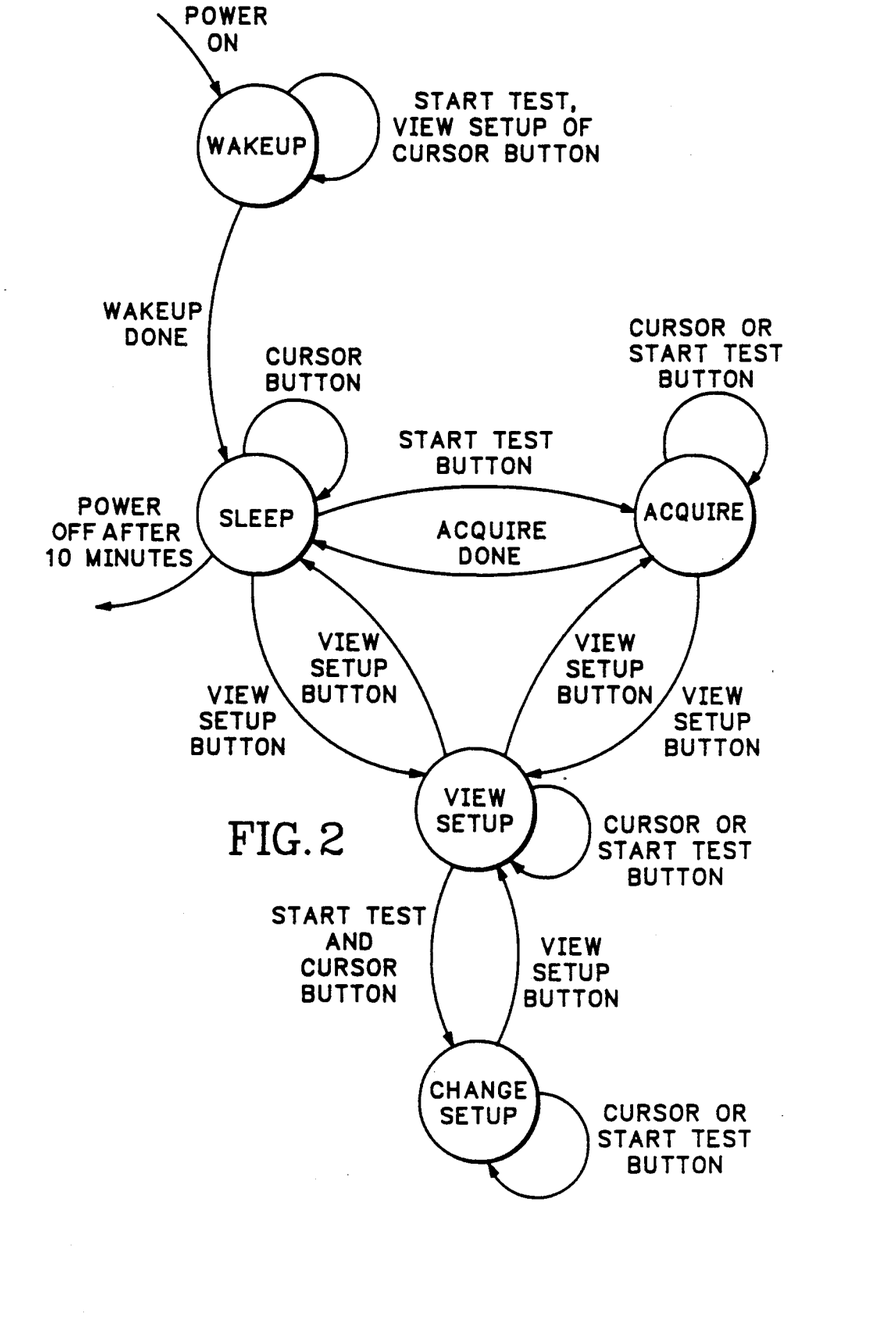
FIG. 2 is a state diagram showing the interaction of front panel keys to instrument functions.
Figure 3:
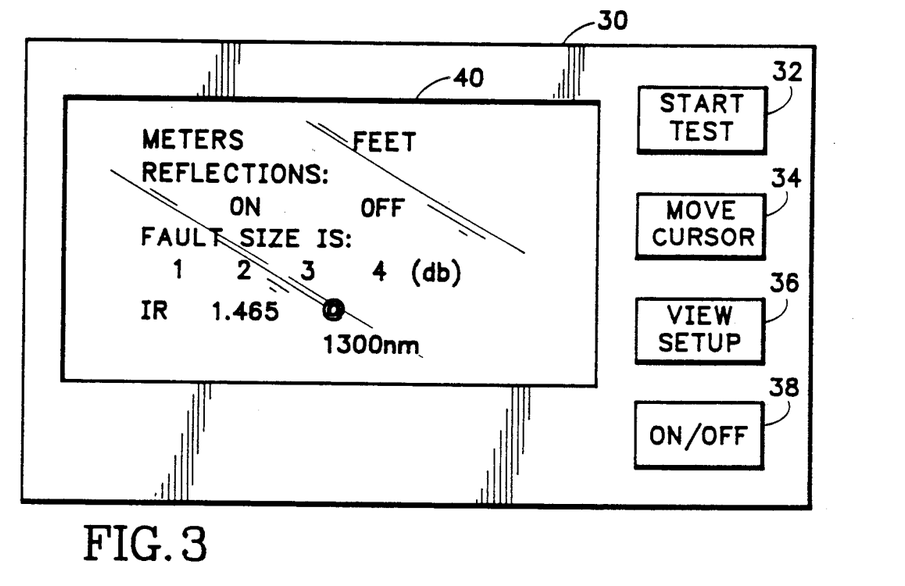
FIG. 3 is an example of the view setup display initiated by the front panel view setup key.

Referring to FIGS. 2 and 3, there are shown, respectively, a state diagram and a front panel 30 for an electronic test instrument that produces a display of acquired data. The front panel 30 consists of depressible keys labeled START TEST, MOVE CURSOR, VIEW SETUP, and ON/OFF and respectively numbered 32, 34, 36, and 38. Also included on the front panel is a display area 40, such as a liquid crystal display, a cathode ray tube, or the like. When the ON/OFF key 36 is depressed, power is applied to the instrument via a line voltage or a battery and the instrument goes into a wake-up state where a self test is performed. If the instrument is working properly, it goes into a sleep state waiting for one of the front panel keys 32-38 to be depressed. If this does not occur within ten minutes, the instrument automatically shuts off.

From the sleep state, depressing the START TEST key 32 starts the acquisition of data from the system under test. Depressing the VIEW SETUP key 36 displays a view setup menu for establishing the parameters for the test. In the view setup mode, concurrently depressing the START TEST and the MOVE CURSOR keys 32 and 34 switches the instrument into a change setup mode where the instrument parameters can be modified. Depressing the MOVE CURSOR key 34 switches from setting to setting within each parameter. Depressing the START TEST key 32 sets the setting for a given parameter and invokes the next parameter. Depressing the VIEW SETUP key 36 re-displays the view setup menu. Depressing the VIEW SETUP key 36 again places the instrument in the sleep state.

As previously stated, depressing the START TEST key 32 while the instrument is in the sleep state starts the acquisition of data from the system under test. Depressing the VIEW SETUP key 36 while data is being acquired causes the acquisition of data to halt in place and the instrument displays the view setup menu with the selected parameters. Concurrently depressing the START TEST and MOVE CURSOR keys 32 and 34 switches the instrument into the change setup where the type of units in which the display is shown and the index of refraction of the cable can be changed. As is discussed in greater detail below, the units and index of refraction parameters are used in display calculations and do not affect the acquisition of data. Depressing the VIEW SETUP key 36 again causes the instrument to start acquiring data from where the interruption occurred. Alternatively, the instrument can be designed so that parameters can be viewed during the acquisition of data but not changed.

Within the display area 40 of FIG. 3, there is shown a specific example of a view setup menu for an instrument for acquiring and displaying time domain reflectometry data. Parameters that can be setup in this display are the type of units in which the display is shown, whether reflections are to be captured, the minimum or threshold loss level that is to be detected during a test, the index of refraction of the cable, and whether the fiber optic cable is 850 or 1300 nm cable. As was discussed with the state machine diagram of FIG. 2, these parameters are set with the front panel keys 32-36.

Figure 4A:
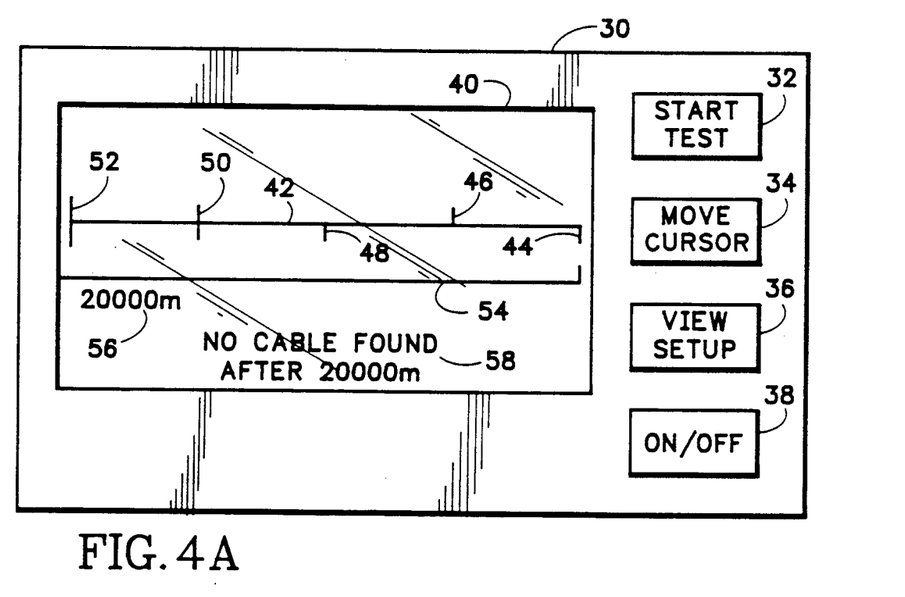
FIG. 4A–4E are representative displays of time domain reflectometry data that can be displayed using the present invention.

Referring now to FIG. 4A, there is shown a front panel 30 with an easily readable display of acquired time domain reflectometry data. The front panel 30, the keys 32-38, and the display area 40 are the same as in FIG. 3. As was previously discussed, data is acquired after the START TEST key 32 is depressed. Data events are acquired and stored in memory only if they fall within the parameters setup using the view setup menu. For the time domain reflectometry display discussed below, the data acquired for each data point consists of a type of event component, a loss component, and a delay time component related to the time it takes for a light pulse to travel from the front end of the instrument to the event and back. After the test is completed and all the data is acquired, a full screen base line display 42 is presented in the display area 40 with icons 44, 46, 48, 50, and 52 plotted on the base line display 42 symbolizing events occurring in the optical cable under test. A cursor 54 is also displayed having a maximum length equal to the length of base line display 42. An alphanumeric distance display 56 is associated with cursor 54 indicating the length of the cable from the start of the cable to a particular icon pointed to by the cursor 54. Below the base line display 42, cursor 54, and display 56 is an area in the display area 40 for a second alphanumeric display 58 indicating the type of event pointed to by the cursor and the signal loss if any.

Figure 4B:
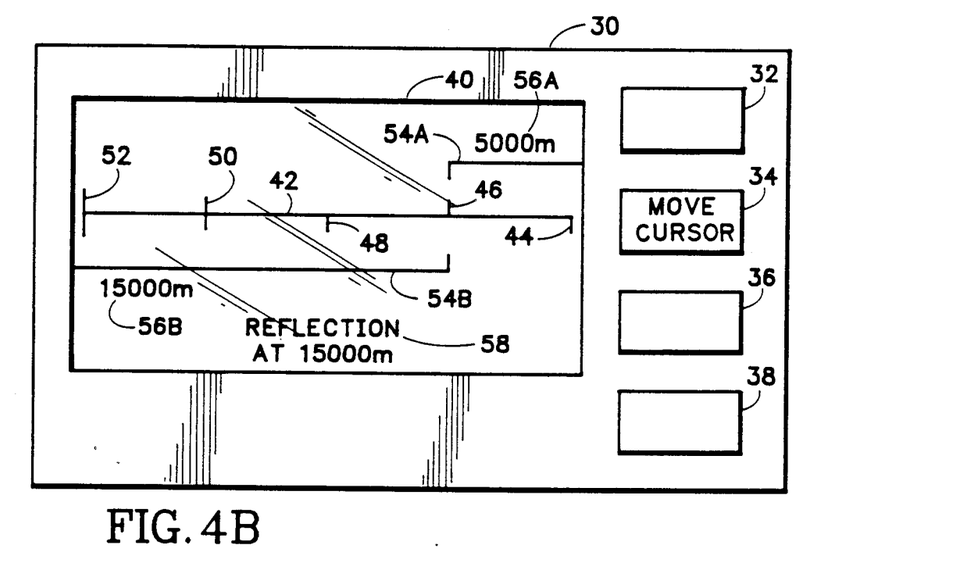

Referring to FIG. 4B, the display has been modified by depressing the MOVE CURSOR key 34. The cursor 54 moves to the next event location, icon, on the base line display 42. If the cursor 54 is not pointing to the start or the end event on the base line display 42, it bifurcates with a portion of the cursor 54A divergent from the pointed event toward the end event on the base line display 42 and a portion of the cursor 54B divergent in the other direction toward the start event on the base line display 42. Associated with each portion of the bifurcated cursor 54A and 54B are alphanumeric displays, respectively 56A and 56B, showing the length of the cable from the event where the cursors 54A and 54B are located to the end of the cable and the length of the cable from the start of the cable to the event. The alphanumeric display 58 is updated to show the type of event that is being pointed to by the cursors 54A and 54B and the distance from the start of the cable to the event.

Figure 4C:
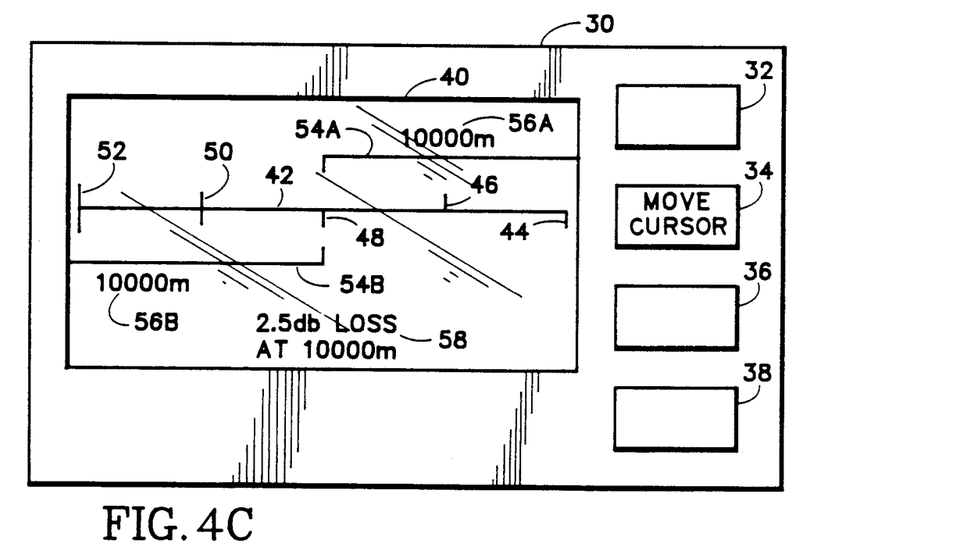
Figure 4D:
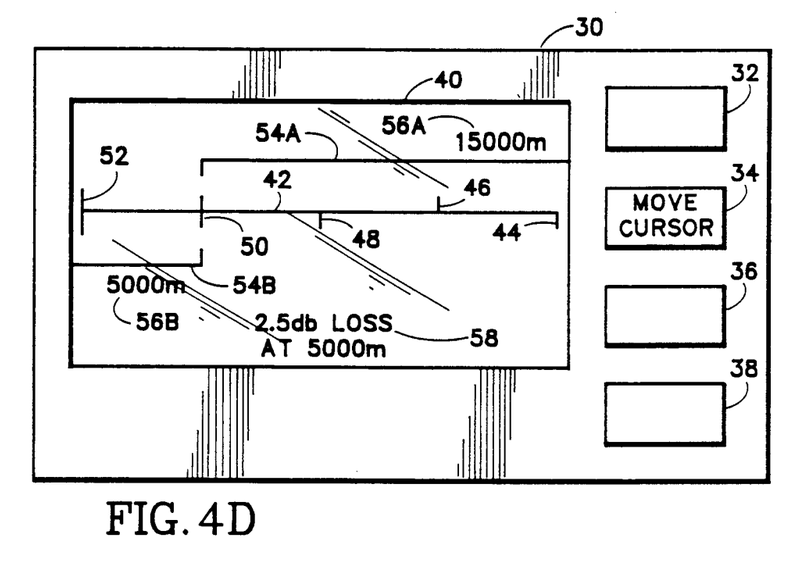
Figure 4E:
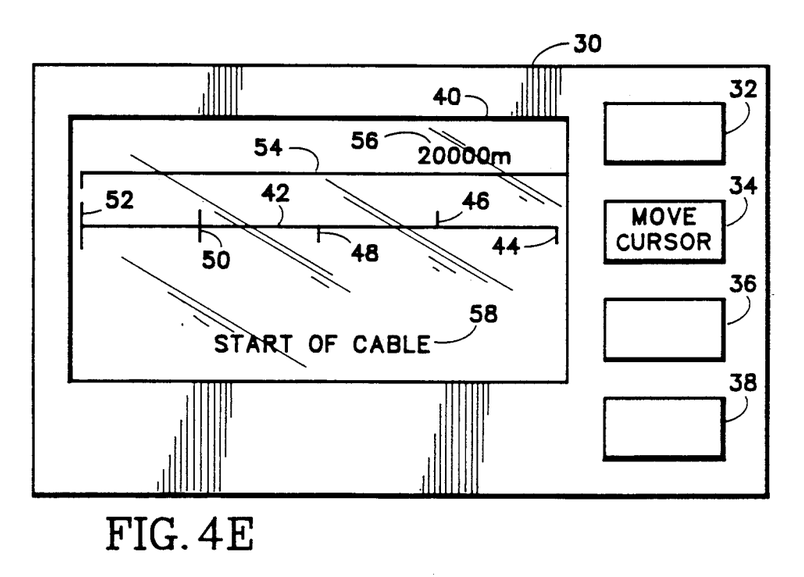

FIGS. 4C-4E show the positioning of the cursor 54 at other events along the base line display 42 and the various display changes that occur, namely the bifurcation of cursor 54 into 54A and 54B and the associated alphanumeric distance displays 56A and 56B. In addition, the event and distance display 58 changes to show the distance from the start of the cable to the event pointed to by the bifurcated cursor 54A and 54B. As can be seen in the drawing, continually depressing the MOVE CURSOR key 34 causes the cursor and its associated display to move from one event location on the base line display to another until the start of cable is reached whereupon the display goes back to the end of the cable event as shown in FIG. 4A.

Figure 5:
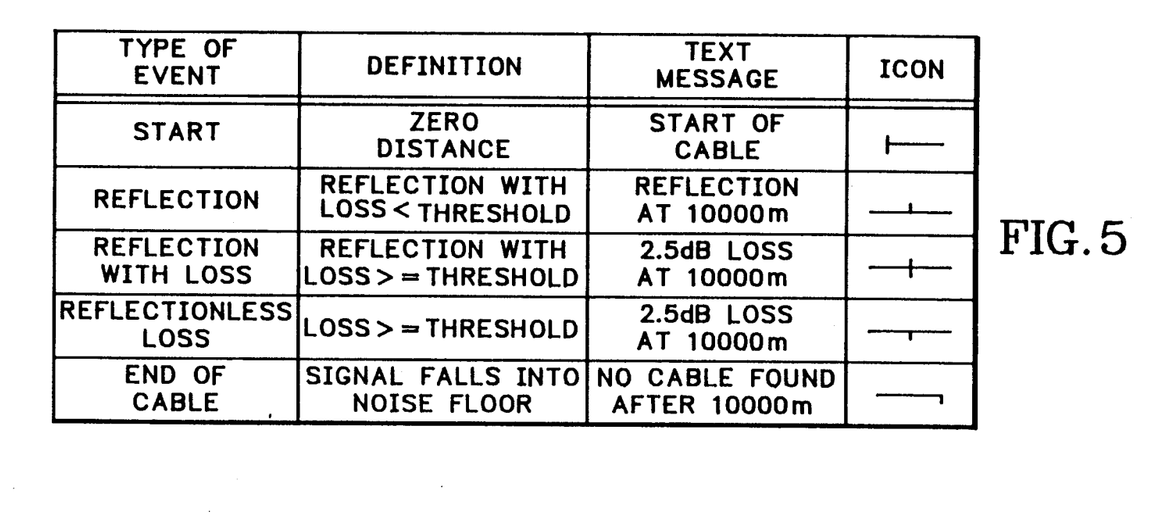
FIG. 5 is a chart showing examples of icons used for graphically symbolizing events on a base line display.

FIG. 5 is a chart showing representative icons that are displayed on the base line display 42. The icons shown in the chart are representative and it should not be inferred that these are the only icons that can be used. The chart includes the type of event represented by the icon, a definition of the icon, the alphanumeric display 58 that would be presented on display 40, and the graphical representation of the icon that would be displayed.

Figure 6A:
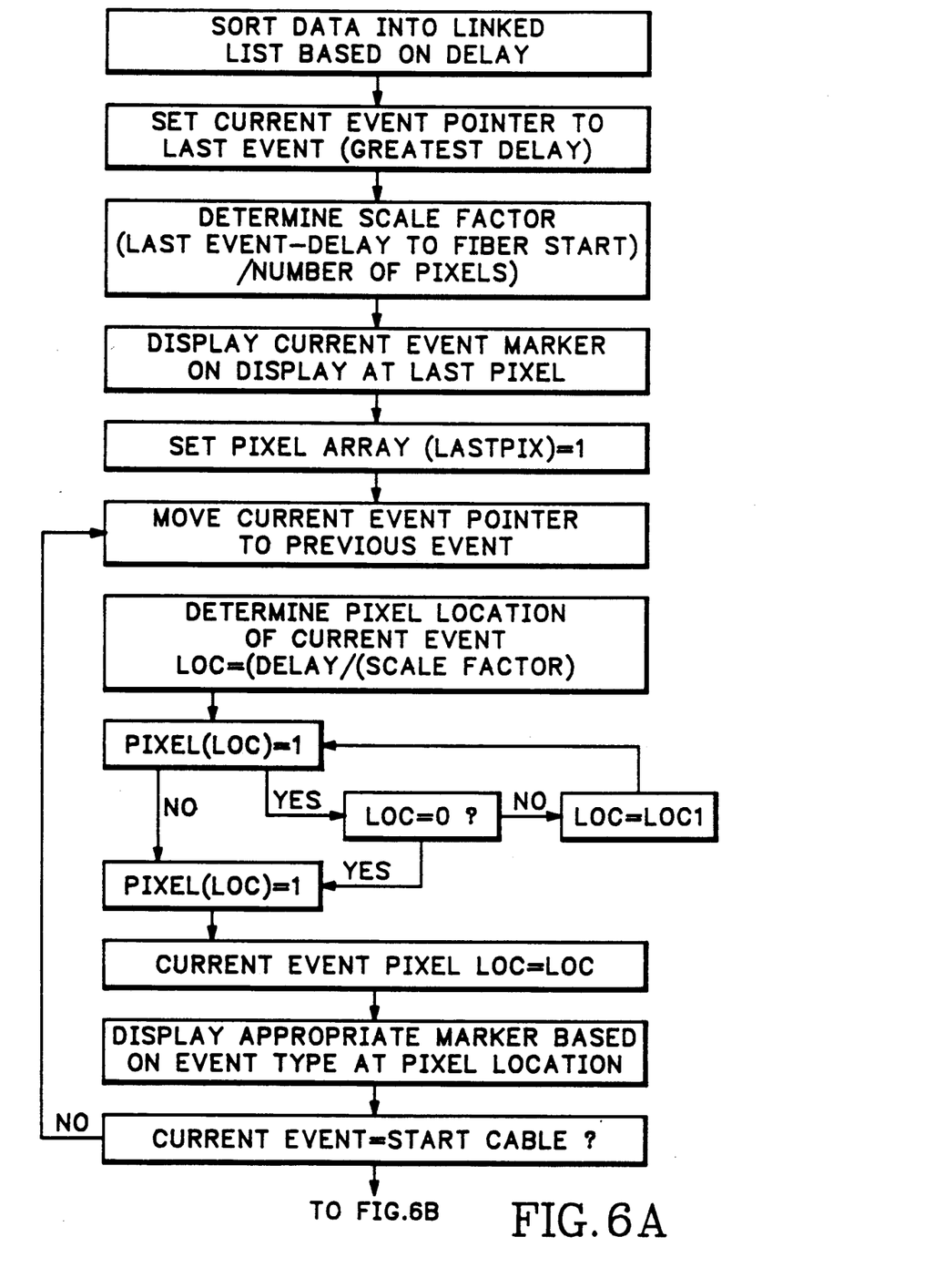
FIGS. 6A and 6B are a flow chart showing the scaling function, the determination of the pixel locations for acquired data points, and the displaying of the acquired data.
Figure 6B:
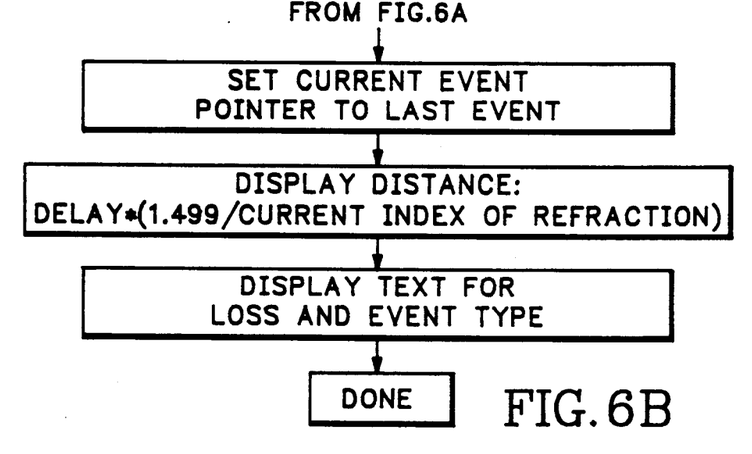

Referring to FIGS. 6A and 6B, there is shown a flow chart for processing the acquired time domain reflectometry data and displaying the data in graphical form using symbolic icons on the base line display 42. As was previously described, during the acquisition of the data only those events meeting the preselected parameters setup in the view setup menu are stored. Each acquired data point for an event has a delay time component, a type of event component, and a loss component if detected. When the last event is found, the acquired data points are sorted into a linked list based on the delay times for each event. A current event pointer points to the acquired data point with the longest time delay. A scaling factor is calculated by determining the number of delay events, delay time, per pixel for the base line display 42, e.g. 128 pixels for the base line display in FIGS. 4A-4E. The total delay count for the fiber optic cable under test is determined by subtracting the delay time of the fiber starting point from the delay time of the last event.

As stated earlier, the current event pointer is at the last acquired event, data point, and an icon symbolic of the type of event component stored in memory for that data point is displayed at the last pixel location on the base line display 42. A pixel array is defined in memory equal to the number of pixel locations on the base line display 42 and a value of one is placed in the array location corresponding to the last pixel location on the base line display 42 indicating that an event is at that location. The current event pointer is moved to the previous acquired data event and the pixel location of this event is determined by dividing the delay time for the event by the scaling factor. A determination is then made to see if the current pixel location for the data point falls on a previous pixel location for another data point. If this occurs, the current data point is offset to an adjacent pixel location so as not to overlap a previous data point. The pixel location is marked by placing a value of one in the pixel array. The current data point icon is displayed on the base line display 42 at the appropriate pixel location representing the type of event that occurred. The current event pointer is moved to the next data point and the process of locating and displaying the data is repeated until the start of the cable event is processed. The current event pointer is then repositioned to the last data event and cursor 54, distance display 56, and alphanumeric event and distance display 58 are displayed with information relating to the current event.

Figure 7:
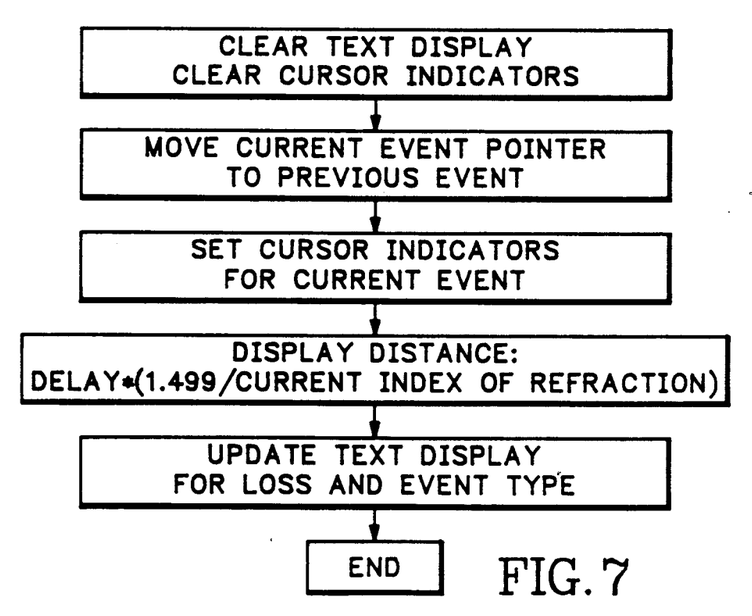
FIG. 7 is a flow chart showing the updating of the display after movement of the cursor.

Referring now to FIG. 7, there is a flow chart showing the updating of the display when the MOVE CURSOR key 34 is depressed. The text display and the cursor are cleared from the display and the current event pointer is repositioned to the previous event data point. The cursor is then set for the current event. As indicated above, when the current event data point is not on the start or end of the base line display 42, the cursor bifurcates with a portion of the cursor above the base line display 42 divergent from the current event to the end of the display and a second portion of the cursor divergent from the current event to the start of the display. The distance to the event data from the start of the cable is calculated from the delay time component of the event times a known index of refraction, specifically 1.499, divided by the current index of refraction as defined in the view setup menu. The distance information is displayed at 56. The alphanumeric display showing the type of event and loss, if any, is updated and displayed.

A simple and easily readable display for acquired data has been described where icons are used to symbolize the acquired data points occurring in a device under test. A full screen base line display is scaled to represent the total duration of the test and a determination is made as to where each data point is placed on the base line display. Icons, symbolic of the type of event of the acquired data is displayed on the base line display. A cursor and associated alphanumeric displays give information on the location and the type of event pointed to. By using a single MOVE CURSOR key on the front panel, the cursor can be moved from event to event on the base line display with the automatic update of the associated alphanumeric information. These and other aspects of the present invention are set forth in the appended claims.

I claim:

1. An improved method of displaying optical time domain reflectometry data wherein the data represents events occurring within a fiber under test with each event having a type of event component, a delay time component, and a signal loss component, the steps comprising:
   determining a total time delay between a start event and and end event for calculating a scale factor for a full screen base line display, the scale factor being a function of the total time delay and length of the base line display;
   determining a location on the full screen base line display for a first event using the delay time component for the first event and the calculated scale factor;
   determining a location on the full screen base line display for a second event using the delay time component for the second event and the calculated scale factor;
   offsetting the second event location from the first event location if the locations coincide on the display; and
   displaying at the determined event locations on the full screen base line display a graphical symbol representative of the type of event component for each event.

2. The improved method of displaying acquired time domain reflectometry data as recited in claim 1 further comprising the steps of:
   providing a bifurcated cursor substantially parallel to the base line display wherein the bifurcated cursor has a first portion above the base line display being divergent from the first event location in a first direction and a second portion below the base line being divergent from the first event location in an opposite direction;
   providing a first alphanumeric display associated with the bifurcated cursor indicating distances from the first event to the start and end events; and
   providing a second alphanumeric display indicating the type of event and the amount of signal loss as a function of the type of event component and the signal loss component.

3. The improved method of displaying acquired time domain reflectometry data as recited in claim 2 further comprising the step of moving the bifurcated cursor from the first event location to the second event location and concurrently updating the first and second alphanumeric displays as a function of the delay time, the type of event, and the amount of loss components.

4. The improved method of displaying acquired time domain reflectometry data as recited in claim 1 further comprising the steps of:
   establishing a pixel array equivalent to the full screen base line display; and
   calculating a pixel location for each event as a function of the delay time component for the event and the scale factor.

* * * * *